United States Patent [19]
Jeffries et al.

[11] Patent Number: 6,111,747
[45] Date of Patent: *Aug. 29, 2000

[54] UNIVERSAL RETENTION APPARATUS

[75] Inventors: John Jeffries, Marble Falls; Stephen Cook, Georgetown, both of Tex.

[73] Assignee: Dell USA, L.P., Round Rock, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 09/174,979

[22] Filed: Oct. 19, 1998

[51] Int. Cl.⁷ .................................. G06F 1/16; H05K 7/12
[52] U.S. Cl. .................. 361/684; 361/802; 361/740; 439/377
[58] Field of Search .................................. 361/685, 740, 361/801, 802, 756, 684, 683; 439/377; 211/41.17

[56] References Cited

U.S. PATENT DOCUMENTS

| | | | |
|---|---|---|---|
| 3,829,741 | 8/1974 | Athey | 361/756 |
| 5,162,979 | 11/1992 | Anzelone et al. | 439/633 |
| 5,227,614 | 7/1993 | Danielson et al. | 235/380 |
| 5,590,023 | 12/1996 | Hernandez et al. | 361/683 |
| 5,726,865 | 3/1998 | Webb et al. | 361/801 |
| 5,829,601 | 11/1998 | Yurchenco et al. | 361/740 |
| 5,889,656 | 3/1999 | Yin | 361/801 |
| 5,943,218 | 8/1999 | Liu | 361/801 |

*Primary Examiner*—Leo P. Picard
*Assistant Examiner*—John D. Reed
*Attorney, Agent, or Firm*—Skjerven, Morrill, MacPherson, Franklin & Friel, LLP; Ken J. Koestner; Margaret M. Kelton

[57] ABSTRACT

An apparatus for securing a board in a connected position includes at least a first edge and a second edge, the apparatus including at least a first retention arm capable of holding in a connected position a first edge of the board, wherein the board is chosen from a plurality of circuit board cards, a heatsink thermal plate coupled to a circuit board card, and a heatsink thermal plate. A computer system includes at least one processor; a memory coupled to the processor and an apparatus for securing a board in a connected position, the device having at least a first edge and a second edge, the apparatus having at least a first retention arm capable of holding in a connected position a first edge of the board, wherein the board is chosen from a plurality of circuit board cards, a heatsink thermal plate coupled to a circuit board card, and a heatsink thermal plate.

28 Claims, 4 Drawing Sheets

UNIVERSAL RETENTION APPARATUS

BACKGROUND OF THE INVENTION

1. Field of the Invention

This invention relates in general to computer systems, and more specifically to a universal retention apparatus for a circuit board.

2. Description of the Related Art

Personal computer systems have attained widespread use. A personal computer system can usually be defined as a desktop or portable microcomputer that includes a system unit having a system processor or central processing unit (CPU) with associated memory, a display panel, a keyboard, a hard disk storage device or other type of storage media such as a floppy disk drive or a compact disk read only memory (CD ROM) drive. These personal computer systems are information handling systems that are designed primarily to give independent computing power to a single user or group of users and are inexpensively priced for purchase by individuals or small businesses.

Efficiency is desirable for computer systems that are expandable/upgradable. In such expandable and upgradable personal computer systems, the so-called "motherboard" or system planar of the computer is designed for add-on boards or daughter cards, for example, processors or memory circuit board cards that can be easily exchanged or upgraded. Typically, modern computer systems have such processors and memory circuit board cards located in a cartridge installed directly on the motherboard or another circuit board and held in place by a retention apparatus.

There are several important considerations for a retention apparatus. The retention apparatus must permit the daughter card to connect to a connector coupled to the main circuit board. Further, the retention apparatus must hold the daughter card in a connected position orthogonal to the circuit board with the connector. The design of the apparatus dictates the size and style of cartridges capable of installation. A retention apparatus that enables a computer system to install different types of cartridges is desirable in terms of efficiency and upgradability. An efficient retention apparatus enables a manufacturer to package microprocessors using single-edge technology. Single-edge technology allows microprocessors to be mounted onto single-edge processor cards, which can then be inserted into single edge connectors. The single-edge connector is mounted on a circuit board.

Another consideration for a retention apparatus is whether the apparatus can support a heatsink coupled to the daughter card. Heatsinks are becoming more and more necessary due to advances in microprocessor technology. Such advances have increased both the operating speed and the heat produced by microprocessors. Therefore, processor circuit board cards generate more heat than earlier processors. Typically, a separate retention apparatus for supporting only a heatsink is coupled to a main circuit board in position close to a heat generating daughter card.

There are a number of processor cartridges available for computer systems including the Single Edge Contact (SEC) processor cartridge and the Single Edge Processor Package (SEPP). Both types of processors are single edge, for example, "PENTIUM II™" and "CELERON™" each have a single-edge contact. However, the designs of an SEC and an SEPP are not compatible. The SEPP has a heatsink thermal plate coupled to the circuit board for the processor. Currently, different retention systems are used depending on the type of computer system assembled. Assembly errors occur when the type of retention apparatus placed on circuit board does not match the processor to be installed later in the manufacturing process. Moreover, a customer purchasing a system with a retention apparatus for only one type of single edge processor cannot alter the computer system without also altering the type of retention apparatus, thereby increasing the cost of any upgrade.

What is needed is a universal retention apparatus that is capable of attaching more than one type of single-edge processor card. Further, a universal retention apparatus is needed that can support a heat sink as well as a processor card.

SUMMARY OF THE INVENTION

It has been discovered that a retention apparatus can be constructed that can hold multiple types of daughter cards as well as daughter cards with heat sinks coupled thereto.

In accordance with an embodiment of the present invention, an apparatus is presented for securing a board in a connected position, the device having at least a first edge and a second edge, the apparatus including at least a first retention arm capable of holding in a connected position a first edge of the board, wherein the board is chosen from a plurality of circuit board cards, a heatsink thermal plate coupled to a circuit board card, and a heatsink thermal plate.

In accordance with an additional embodiment, a computer system is presented including at least one processor; a memory coupled to the processor and an apparatus for securing a board in a connected position, the device having at least a first edge and a second edge, the apparatus having at least a first retention arm capable of holding in a connected position a first edge of the board, wherein the board is chosen from a plurality of circuit board cards, a heatsink thermal plate coupled to a circuit board card, and a heatsink thermal plate.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Referring to the figures, a universal retention apparatus is illustrated using various views. The apparatus advantageously allows the installation of at least two types of processor cartridges, for example, a Single Edge Contact (SEC) processor cartridge and a Single Edge Processor Package (SEPP).

Figure 1:
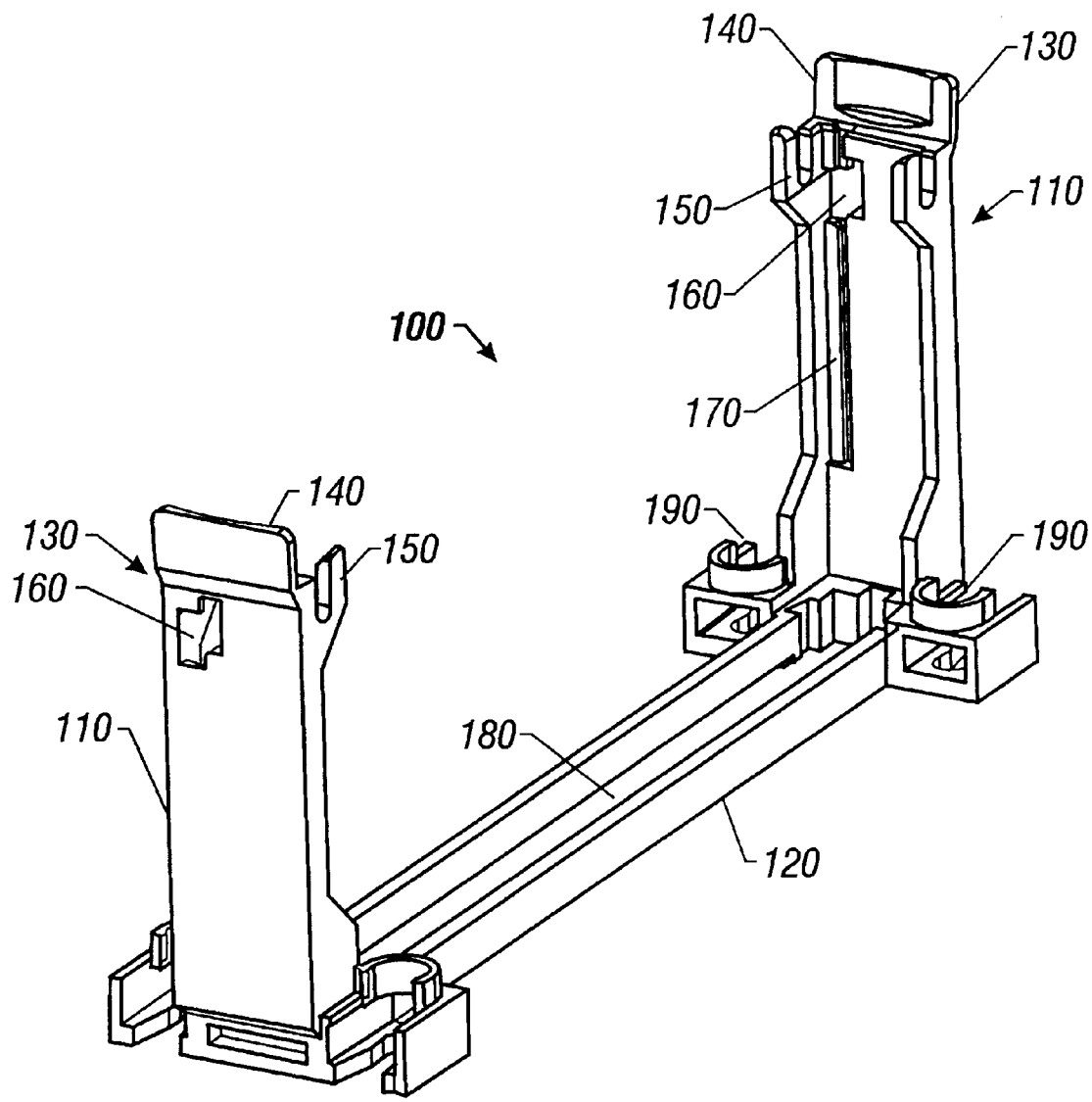
FIG 1 is a perspective view of the retention apparatus in accordance with an embodiment of the present invention shown empty with no processor installed.

FIG. 1 shows a perspective view of a retention apparatus 100 without a circuit board installed and without the retention apparatus 100 connected to a circuit board or mother board. The illustrative retention apparatus 100 has a single body part constructed of a rigid material such as polycarbonate, Acrylo Butadiene Styrene (ABS), or polyvinylchloride (PVC) resin, or a blend of polycarbonate and ABS, such as BAYBLEND produced by BAYER Corporation.

The retention apparatus 100 includes retention arms 110 and a transverse base 120 coupled to the arms 110 at each end of the base 120. Thus, the embodiment shown in FIG. 1 is stirrup shaped thereby allowing a circuit board card, typically called a "daughter card" to be installed between the arms 110 and through a hollow in the base. The hollow 180 in the base 120 permits the daughter card to be installed into a connector, typically a female connector, that can fit through the hollow 180. Other structures may also be used. For example, a single arm embodiment employs a single retention arm.

The arms 110 have a top portion 130 that is shaped with unique characteristics. First, the very top portion 130 of each arm 110 includes an actuator 140. Depressing the actuator 140 spreads the arms 110 of the retention apparatus 100 thereby allowing a processor daughter card, including either an SEC or an SEPP, to be installed into the retention apparatus 100. Such a daughter card processor is perpendicularly situated relative to the surface of the main circuit board to which the retention apparatus 100 attaches.

The top portion 130 of the arms 110 further include U-shaped appendages 150 joining the arms 110. FIG. 1 shows two U-shaped appendages 150 on each arm 110. The U-shaped appendages 150 assist in positioning a single-edge processor in position perpendicular to a circuit board. The U-shaped appendages 150 position SEC-type processors.

Also shown in FIG. 1 on the top portion 130 of the arms 110 is a specially designed notch 160. Notch 160 accommodates processor packages with appendages that are present on SEC cartridges, for example, including the appendages present on Single Edge Contact (SEC) processor cartridges as well as Single Edge Processor Packages (SEPP). The notch 160 in combination with other aspects of the structure allow efficient assembly of single-edge processors by not requiring different retention apparatuses to be installed for different types of single-edge processors. The structure accomplishes this by using the same notch 160 for different types of single-edge processors. The notch 160 in the example is shaped substantially as two offset rectangles abutting each other and sharing a part of one side. Thus, the notch 160 appears to be eight-sided in FIG. 1. An SEC-type processor uses a portion of the notch 160 and an SEPP-type processor uses another portion of the notch 160 as described below. Notches having other suitable shapes may also be used.

Another aspect included in each of the arms 110 is a grooved area 170 that functions to guide the edges of a heatsink thermal plate that is typically part of an SEPP. The groove also functions as a guide for edges of a heatsink thermal plate alone that is not part of an SEPP. The groove is not used for installing an SEC-type processor.

Also shown in FIG. 1, appendages 190 join the base of the apparatus to permit captive nuts or rivets to couple the retention apparatus to a circuit board, such as a mother board. The appendages 190 are semi-circular to permit efficient assembly. The shape allows the fasteners, such as captive nuts and rivets, to be quickly placed during assembly.

Figure 2:
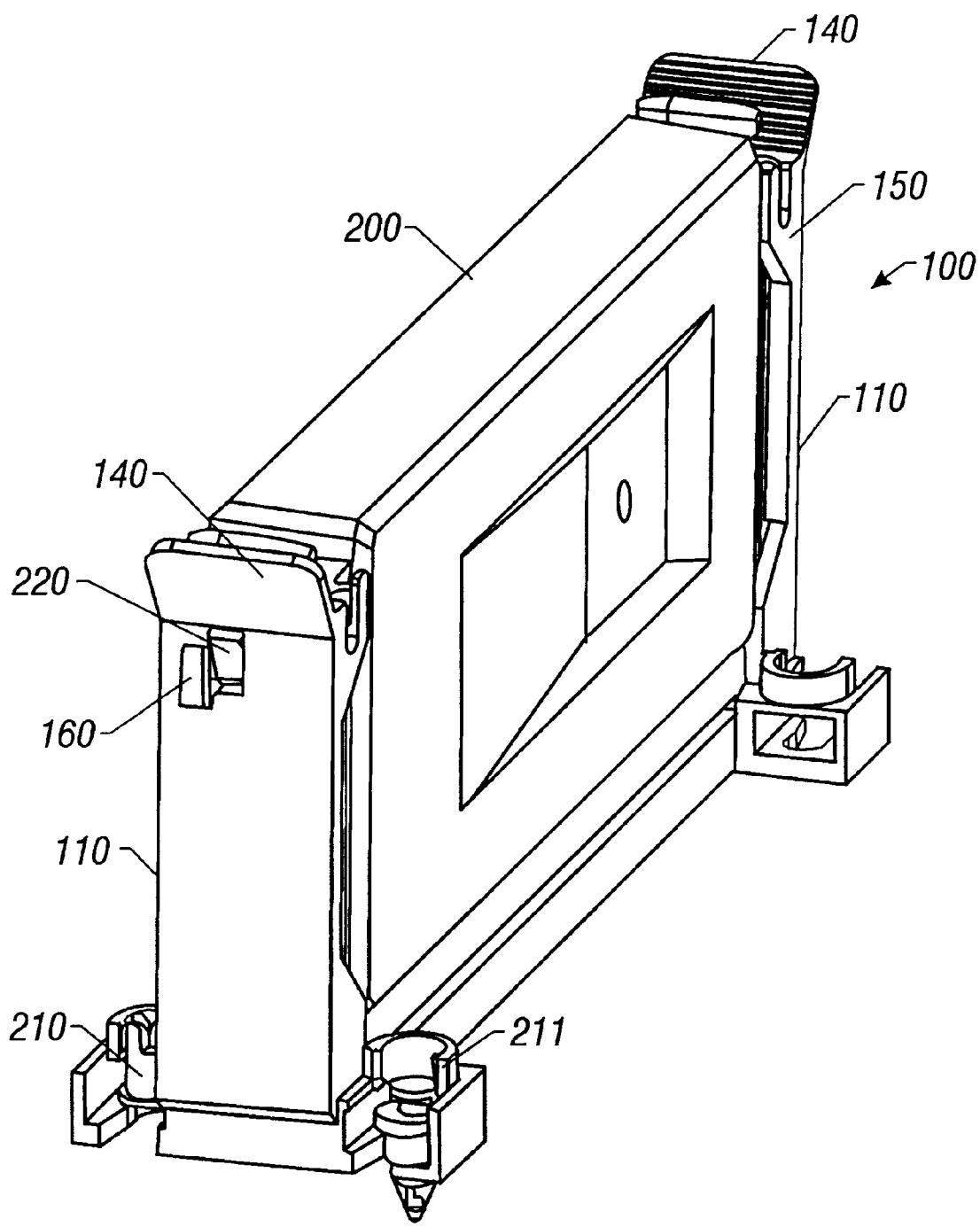
FIG. 2 is a perspective view of the retention apparatus in accordance with an embodiment of the present invention shown with a processor installed.

Referring to FIG. 2, an embodiment shows a single-edge processor cartridge 200 installed into the retention apparatus 100. FIG. 2 shows the captive nuts 210 installed for the purpose of coupling the retention apparatus 100 to a circuit board. FIG. 2 also shows the rivets 211 installed for the purpose of coupling the retention apparatus 100 to a circuit board.

FIG. 2 depicts how a single-edge processor daughter card 200 such as an SEC that is not coupled to a heatsink thermal plate fits into the retention apparatus 100. The processor 200 includes a tab 220 that fits into a portion of notch 160. The portion used by the processor 200 is shown in FIG. 2 as the right-hand side of the notch 160, while the left-hand side of the notch 160 is not used. In order to install processor 200, the actuators 140 are be flexed outward so that the processor 200 can be inserted into the retention apparatus 100. Another function of the retention apparatus 100 is that of assisting the positioning of the processor 200 using the U-shaped appendages 150 shown at the top end 130 of the retaining apparatus 100.

Figure 3:
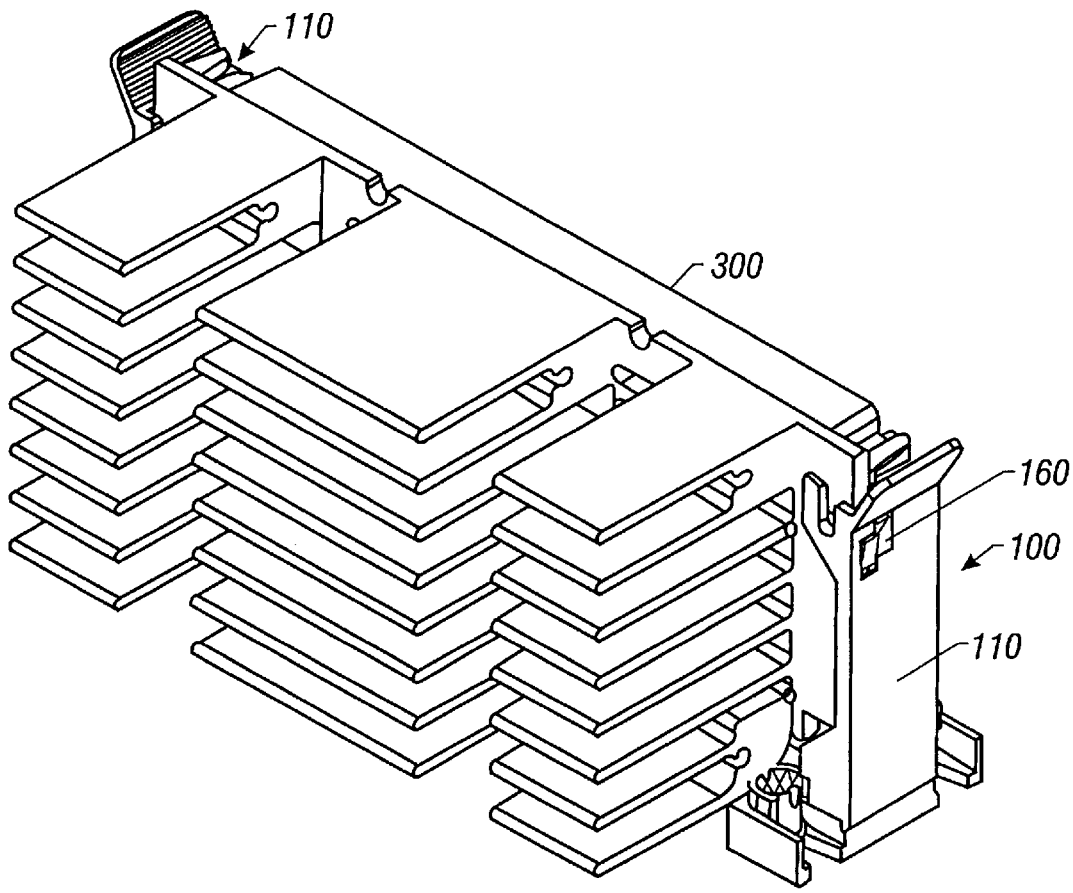
FIG. 3 is a perspective view of a Single Edge Processor Package shown installed into the retention apparatus of FIG. 1.
Figure 4:
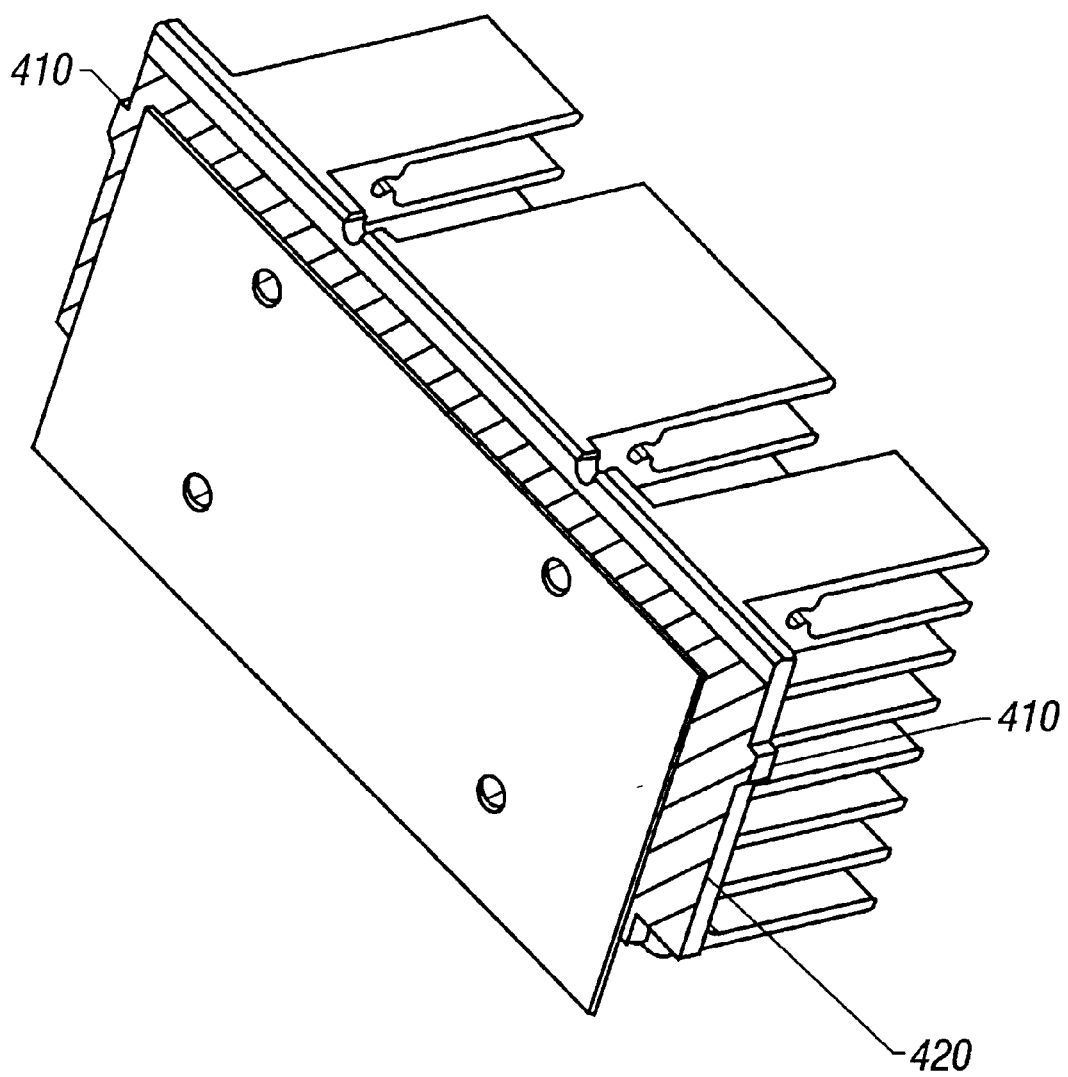
FIG. 4 is a perspective view of a Single Edge Processor Package, for use with an embodiment of the present invention, showing tab features, a heatsink thermal plate and an attached processor.

Referring to FIG. 3 and FIG. 4 in combination, a perspective view of the retention apparatus 100 in FIG. 3 holds an SEPP 300 in place using the notch 160. FIG. 3 demonstrates how the apparatus 100 uses different components for maintaining an SEPP 300 in position as compared to the components used for maintaining an SEC in position. Unlike the view shown in FIG. 2 that demonstrates how the apparatus 100 holds an SEC in position, the view in FIG. 3 shows how the retention apparatus 100 holds the SEC using the left-hand side of notch 160 instead of the right-hand side of the notch 160. FIG. 4 presents an SEPP prior to installing into the retention apparatus 100. The tab 410 shown in FIG. 4 is joined to the edge of the heatsink thermal plate 420. This tab 410 fits into the left-hand side of the notch 160. Like the manner in which the retention apparatus 100 accepts an SEC, as depicted in FIG. 2, the manner in which the retention apparatus 100 accepts an SEPP also employs outward flexing of the retention arms 110.

Additionally, FIG. 3 depicts how the apparatus 100 uses the groove (not shown) disposed on the interior side of each retention arm 110 for holding the SEPP 300 in position. The heatsink thermal plate 420 has an edge on each side to which a tab 410 is joined. These edges of the heatsink thermal plate 420 fit into the grooves of the retention apparatus 100.

While the invention has been described with reference to various embodiments, it will be understood that these embodiments are illustrative and that the scope of the invention is not limited to them. Many variations, modifications, additions and improvements of the embodiments described are possible. Variations and modifications of the embodiments disclosed herein may be made based on the description set forth herein, without departing from the scope and spirit of the invention as set forth in the following claims.

What is claimed is:

1. An apparatus for securing a computer card in a connected position, the computer card being any of a type of a plurality of computer card types, the apparatus comprising:

at least one elongated retention arm for holding an edge of a computer card in a connected position, each of the at least one retention arms including an interior surface defining a notch shaped substantially as two offset rectangles sharing a part of one side, the notch interchangeably receiving at least one structure of a computer card in a connected position, wherein the at least one structure received is dependent upon the card type of the computer card;

wherein each of the at least one elongated retention arms further includes an actuator disposed at the top of the arm that flexes outward upon exertion of an external force to facilitate insertion or removal of a computer card.

2. The apparatus of claim 1 wherein the interior surface of each elongated retention arm faces the edge of a computer card in a connected position.

3. The apparatus of claim 1 wherein the interior surface of each elongated retention arm further defines a groove located lengthwise along the interior surface, the groove selectively receiving an edge of a thermal plate of a computer card depending upon the card type of the computer card.

4. The apparatus of claim 1 wherein the at least one retention arm includes a first retention arm and a second retention arm, the interior surface of the first retention arm faces the interior surface of the second retention arm.

5. The apparatus of claim 4 wherein the notch located in the first retention arm and the notch located in the second retention arm are mirror images of each other.

6. The apparatus of claim 1 further comprising:

a base connected to the bottom end of the at least one retention arm, the base defining a hollow for allowing the base to surround a connector, the connector for receiving a conductive edge of a computer card in a connected position.

7. The apparatus of claim 1 further comprising:

a base connected to the bottom end of the at least one retention arm, the base includes curved members that allow one of captive nuts and rivets to couple the apparatus to a circuit board.

8. The apparatus of claim 1, wherein the at least one retention arm is made from one of polycarbonate, ABS, polyvinylchloride (PVC) resin, and a blend of Polycarbonate and ABS, such as BAYBLEND produced by BAYER Corporation.

9. The apparatus of claim 1, wherein:

each of the at least one retention arms further includes a first and a second U-shaped appendage coupled to the top end of the retention arm.

10. An apparatus for securing a computer card in a connected position, the computer card being any of a type of a plurality of computer card types, the apparatus comprising:

at least one retention arm means for holding an edge of a computer card in a connected position, each of the at least one retention arm means including a first elongated member having an interior side that faces the edge of a computer card in a connected position;

wherein the first elongated member of each of the at least one retention arm means defines a first notch portion means defined in the elongated member, the first notch portion means for receiving a structure of a computer card of a first computer card type in a connected position, the first notch potion means being adjacent to a second notch portion means defined in the elongated member for receiving a structure of a computer card of a second computer card type in a connected position.

11. The apparatus of claim 10 wherein:

the elongated member has a width;
the elongated member defines a groove lengthwise along the interior side, the groove having width that is substantially less than the width of the elongated member, the groove for receiving an edge portion of a thermally conductive plate of a card of the first card type.

12. The apparatus of claim 10 wherein the received structure of the computer card of the first computer card type includes a portion of a thermally conductive plate.

13. The apparatus of claim 10 wherein the at least one retention arm means includes a first retention arm means and a second retention arm means, the interior side of the first retention arm means faces the interior side of the second retention arm means.

14. The apparatus of claim 10 further comprising:

a base connected to the bottom end of the at least one retention arm means, the base defining a hollow for allowing the base to surround a connector, the connector for receiving a conductive edge of a computer card in a connected position.

15. The apparatus of claim 10 further comprising:

a base connected to the bottom end of the at least one retention arm means, the base includes curved members that allow one of captive nuts and rivets to couple the apparatus to a circuit board.

16. The apparatus of claim 10 wherein the first and second computer card types are processor daughter card types.

17. The apparatus of claim 10 wherein the first processor daughter card type includes a Single Edge Contact (SEC) processor cartridge and the second processor daughter card type includes a Single-Edge Processor Package (SEPP).

18. The apparatus of claim 10, wherein:

each of the at least one retention arm means further includes a first and a second U-shaped appendage coupled to the top end of the retention arm means.

19. A computer system comprising:

at least one processor;

a memory operably coupled to the at least one processor;

a computer card; and a computer card retention apparatus including:

at least one elongated retention arm with an interior surface defining a notch shaped substantially as two offset rectangles sharing a part of one side, the notch interchangeably receiving at least one structure of the computer card, wherein the at least one structure received is dependent upon the card type of the computer card;

wherein each of the at least one elongated retention arms further includes an actuator disposed at the top of the arm that flexes outward upon exertion of an external force to facilitate insertion or removal of the computer card.

20. The computer system of claim 19 wherein the interior surface of each elongated retention arm further defines a groove located lengthwise along the interior surface, the groove selectively receiving an edge of a thermal plate of the computer card depending upon the card type of the computer card.

21. The computer system of claim 19 wherein the at least one retention arm includes a first retention arm and a second retention arm, the interior surface of the first retention arm faces the interior surface of the second retention arm.

22. The computer system of claim 21 wherein the interior surface of the first and second elongated retention arms each further defines a groove located lengthwise along the interior surface, the grooves of the first and second retention arms are aligned to selectively receive opposing edges of a thermal plate of the computer card depending upon the card type of the computer card.

23. The computer system of claim 19 wherein the notches are capable of receiving structures of a plurality of processor daughter card types retained by the computer card retention apparatus.

24. The computer system of claim 23 wherein the plurality of daughter card types includes a Single Edge Contact (SEC) processor cartridge card type and a Single-Edge Processor Package (SEPP) card type.

25. The computer system of claim 19 wherein the computer card structure includes a thermal plate, wherein the at least one structure received includes a structure of the thermal plate.

26. The computer system of claim 19 further wherein the retention apparatus further includes:

a base connected to the bottom end of the at least one retention arm, the base defining a hollow for allowing the base to surround a connector, the connector receives a conductive edge of the computer card.

27. The computer system of claim 19 further wherein the retention apparatus further includes:

a base connected to the bottom end of the at least one retention arm, the base includes curved members that allow one of captive nuts and rivets to couple the apparatus to a circuit board.

28. The computer system of claim 19 further wherein:

each of the at least one retention arms further includes a first and a second U-shaped appendage coupled to the top end of the retention arm.

* * * * *